(12) United States Patent
Onuki et al.

(10) Patent No.: US 8,823,125 B2
(45) Date of Patent: Sep. 2, 2014

(54) SOLID-STATE IMAGE PICKUP DEVICE AND METHOD FOR MANUFACTURING THE SAME

(75) Inventors: Yusuke Onuki, Fujisawa (JP); Yuichiro Yamashita, Ebina (JP); Masahiro Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/500,064

(22) PCT Filed: Oct. 6, 2010

(86) PCT No.: PCT/JP2010/005977
§ 371 (c)(1),
(2), (4) Date: Apr. 3, 2012

(87) PCT Pub. No.: WO2011/043067
PCT Pub. Date: Apr. 14, 2011

(65) Prior Publication Data
US 2012/0199934 A1    Aug. 9, 2012

(30) Foreign Application Priority Data

Oct. 9, 2009 (JP) ................................. 2009-235089

(51) Int. Cl.
| | |
|---|---|
| H01L 27/146 | (2006.01) |
| H01L 31/06 | (2012.01) |
| H01L 31/102 | (2006.01) |
| H01L 31/062 | (2012.01) |
| H01L 31/113 | (2006.01) |

(52) U.S. Cl.
USPC ........... 257/443; 257/461; 257/463; 257/292; 257/294

(58) Field of Classification Search
USPC ......... 257/233, 291–293, 431, 443, 450, 458, 257/463–464; 438/48, 54, 65, 69
See application file for complete search history.

(56) References Cited

U.S. PATENT DOCUMENTS

| | | | |
|---|---|---|---|
| 5,014,132 A * | 5/1991 | Kumesawa et al. | 348/311 |
| 5,962,882 A * | 10/1999 | Sin | 257/222 |
| 7,414,233 B2 | 8/2008 | Asaba | |
| 2005/0280046 A1 | 12/2005 | Shin | |
| 2009/0040502 A1 | 2/2009 | Hashimoto | |
| 2009/0251582 A1 | 10/2009 | Oike | |

FOREIGN PATENT DOCUMENTS

| | | |
|---|---|---|
| CN | 1897640 A | 1/2007 |
| EP | 2107610 A2 | 10/2009 |
| JP | 2006-197383 A | 7/2006 |
| JP | 2008-004692 A | 1/2008 |
| JP | 2009-038167 A | 2/2009 |

(Continued)

*Primary Examiner* — Steven Loke
*Assistant Examiner* — Juanita B Rhodes
(74) *Attorney, Agent, or Firm* — Canon USA, Inc. IP Division

(57) ABSTRACT

A solid-state image pickup device includes a photoelectric conversion portion, a charge holding portion configured to include a first-conductivity-type first semiconductor region, and a transfer portion configured to include a transfer gate electrode that controls a potential between the charge holding portion and a sense node. The charge holding portion includes a control electrode. A second-conductivity-type second semiconductor region is disposed on a surface of a semiconductor region between the control electrode and the transfer gate electrode. A first-conductivity-type third semiconductor region is disposed under the second semiconductor region. The third semiconductor region is disposed at a deeper position than the first semiconductor region.

15 Claims, 7 Drawing Sheets

(56) References Cited

FOREIGN PATENT DOCUMENTS

| KR | 10-0192954 B1 | 6/1999 |
| KR | 10-2002-0070850 A | 9/2002 |
| KR | 10-0761824 B1 | 9/2007 |
| KR | 10-2008-0031647 A | 4/2008 |
| KR | 10-2009-0105871 A | 10/2009 |
| WO | 2008/069141 A1 | 6/2008 |
| WO | 2009/136655 A1 | 11/2009 |
| WO | WO 2009136655 A1 * 11/2009 ........... H04N 5/3745 |

\* cited by examiner

SOLID-STATE IMAGE PICKUP DEVICE AND METHOD FOR MANUFACTURING THE SAME

TECHNICAL FIELD

The present invention relates to a solid-state image pickup device. More specifically, the present invention relates to a solid-state image pickup device in which each of pixels has a charge holding portion.

BACKGROUND ART

In recent years, a configuration in which each of pixels has a charge holding portion separated from a photoelectric conversion portion and a floating diffusion (hereinafter FD) has been considered for higher performance of a solid-state image pickup device. The charge holding portion is provided in each pixel in order to realize a global electronic shutter, as described in PTL 1 and PTL 2, or in order to expand a dynamic range, as described in PTL 3. Furthermore, the charge holding portion is provided in each pixel also in a configuration in which each pixel has an analog-to-digital (AD) converter, as described in PTL 4.

PTL 1 discloses a configuration in which a P-type semiconductor region is disposed in a surface portion so as to separate an electrode TX1 on an accumulation region formed of an N-type semiconductor region and an electrode TX2 for transferring charges in the accumulation region from each other. Such a configuration prevents a dark current flowing to the accumulation region.

CITATION LIST

Patent Literature

[PTL 1]
U.S. Pat. No. 7,414,233
[PTL 2]
Japanese Patent Laid-Open No. 2008-004692
[PTL 3]
Japanese Patent Laid-Open No. 2006-197383
[PTL 4]
Japanese Patent Laid-Open No. 2009-038167

SUMMARY OF INVENTION

Technical Problem

According to the configuration of PTL 1, a P-type semiconductor region is disposed so as to separate two transfer gate structures from each other, and an N-type semiconductor region constituting a charge holding portion extends to be disposed thereunder. Charges move in the N-type semiconductor region under the P-type semiconductor region between the transfer gates. The impurity concentration profile of the N-type semiconductor region under the P-type semiconductor region greatly contributes to charge transfer efficiency.

However, in the configuration where the N-type semiconductor region of the charge holding portion extends, a region of high N-type impurity concentration may partially occur. If a high-concentration region occurs, charges accumulate in that region, which may deteriorate transfer efficiency.

The present invention has been made on the basis of this problem, and is directed to increasing charge transfer efficiency from a charge holding portion to an FD.

Solution to Problem

Accordingly, there is provided a solid-state image pickup device including a plurality of pixels, each of the plurality of pixels including: a photoelectric conversion portion configured to generate charges in accordance with incident light; a charge holding portion configured to include a first-conductivity-type first semiconductor region that holds the charges generated by the photoelectric conversion portion in a portion different from the photoelectric conversion portion; and a transfer portion configured to include a transfer gate electrode that controls a potential between the charge holding portion and a sense node. The charge holding portion includes a control electrode that is disposed above the first semiconductor region via an insulating film. A second-conductivity-type second semiconductor region is disposed on a surface of a semiconductor region between the control electrode and the transfer gate electrode. A first-conductivity-type third semiconductor region is disposed under the second semiconductor region, at a position of a charge path extending from the charge holding portion to the sense node. The third semiconductor region is disposed at a deeper position than the first semiconductor region.

Advantageous Effects of Invention

According to an embodiment of the present invention, charge transfer efficiency from a charge holding portion can be increased.

DESCRIPTION OF EMBODIMENTS

Hereinafter, embodiments of the present invention will be described in detail. Regarding the conductivity type of semiconductor, the description will be given under the assumption that a first-conductivity-type is N-type and that a second-conductivity-type is P-type, but the opposite is also acceptable. The difference depends on whether signal charges are electrons or holes. The cross-sectional views of each pixel illustrate a portion of one pixel, but a plurality of pixels are provided in a real device.

First Embodiment

Figure 1:
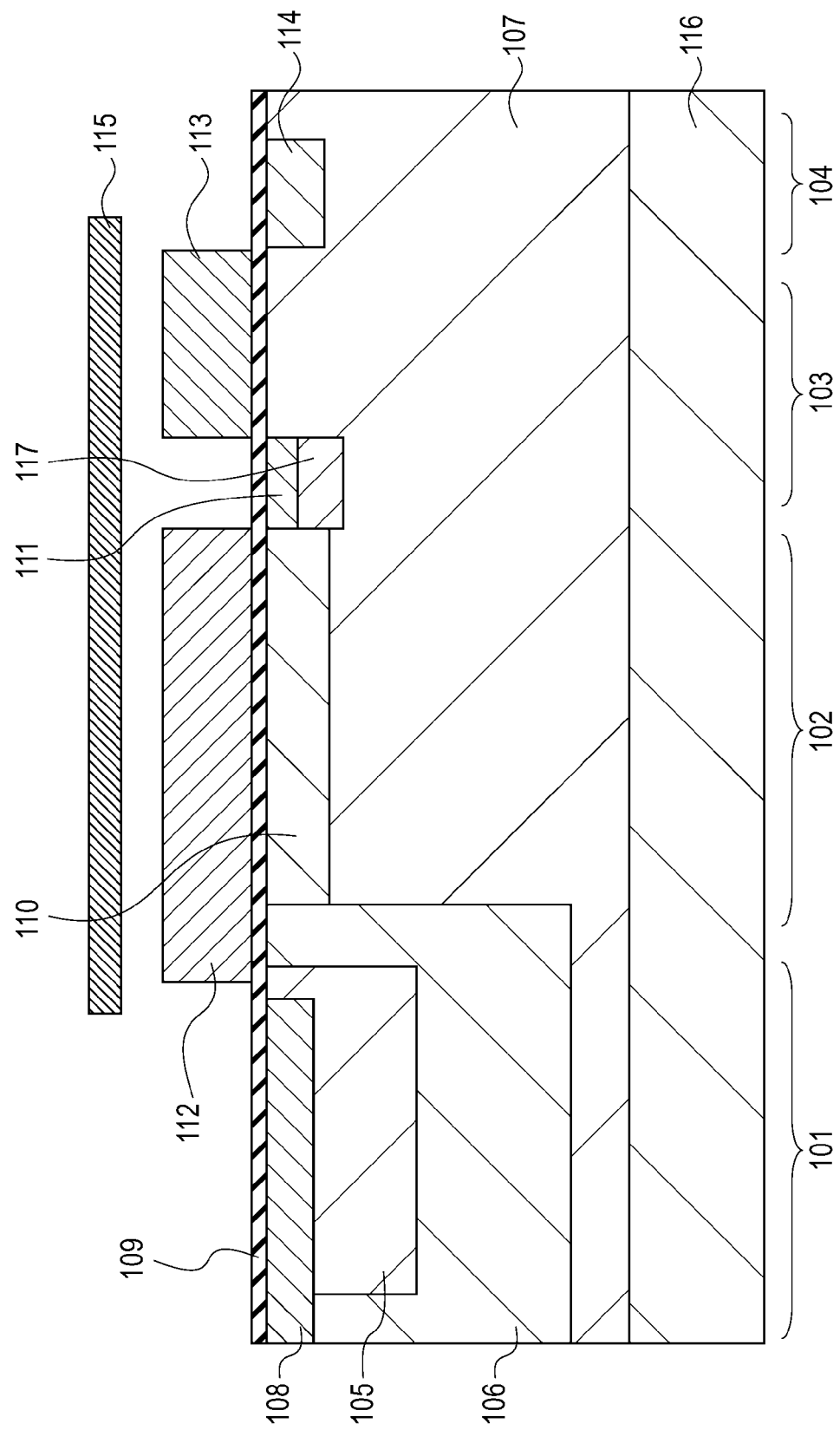
FIG. 1 is a schematic view of a cross section of a pixel of a solid-state image pickup device according to a first embodiment of the present invention.

FIG. 1 is a schematic view of a cross section of a pixel of a solid-state image pickup device according to an embodiment of the present invention.

Reference numeral 101 denotes a photoelectric conversion portion. A photodiode configured to include a P-type semiconductor region and an N-type semiconductor region is used, for example. Reference numeral 102 denotes a charge holding portion. The charge holding portion 102 is configured to include an N-type semiconductor region (first semiconductor region) capable of holding charges generated by the photoelectric conversion portion 101. Reference numeral 103 denotes a transfer portion. The transfer portion 103 transfers charges held by the charge holding portion 102 to a sense node. Reference numeral 104 denotes the sense node. The sense node 104 is a floating diffusion (FD) that is electrically connected to the gate of a metal-oxide semiconductor (MOS) transistor for pixel amplification, for example. The sense node 104 may be electrically connected to a vertical signal line (not illustrated), instead of being electrically connected to the gate of the MOS transistor for pixel amplification.

Next, specific configurations of the foregoing individual members will be described. In this embodiment, the photoelectric conversion portion 101, the charge holding portion 102, the transfer portion 103, and the sense node 104 are arranged in a P-type well 107. The P-type well 107 is formed on a surface side of an N-type substrate 116 through ion implantation or epitaxial growth. A P-type semiconductor substrate may be used instead of the N-type substrate 116 on which the P-type well 107 is formed.

Reference numerals 105 and 106 denote N-type semiconductor regions. The N-type semiconductor region 105 is disposed in the N-type semiconductor region 106 and has an N-type impurity concentration higher than that of the N-type semiconductor region 106. The N-type semiconductor region 105 forms a PN junction together with a P-type semiconductor region 108. The N-type semiconductor region 106 forms a PN junction together with the P-type well 107.

The P-type semiconductor region 108 is a high-concentration P-type semiconductor region. Providing the P-type semiconductor region 108 enables reduction of a dark current that is generated on a surface of semiconductor. In this embodiment, the foregoing photoelectric conversion portion 101 is constituted by the N-type semiconductor regions 105 and 106, the P-type well 107, and the P-type semiconductor region 108.

Reference numeral 110 denotes an N-type semiconductor region. In this embodiment, the N-type semiconductor region 110 is a first semiconductor region that holds charges in a portion different from the photoelectric conversion portion 101. Reference numeral 112 denotes a control electrode. The foregoing charge holding portion 102 is configured to include the N-type semiconductor region 110 and the control electrode 112.

In the charge holding portion 102 according to this embodiment, the control electrode 112 is disposed above the N-type semiconductor region 110 via an insulating film 109. The control electrode 112 controls the potential on a semiconductor surface side of the N-type semiconductor region 110. A negative voltage may be applied to the control electrode 112 so as to suppress an influence of a dark current generated in the charge holding portion 102.

Reference numeral 113 denotes a transfer gate electrode. A bias supplied to the transfer gate electrode 113 causes a transfer path of signal charges to be formed in part of the P-type well 107 adjacent to the N-type semiconductor region 110. The transfer gate electrode 113 switches between a transfer path formation state and a transfer path non-formation state in accordance with a bias supplied thereto, and controls the electrical connection between the charge holding portion 102 and the FD.

An FD 114 is an N-type semiconductor region. In this embodiment, the FD 114 functions as a sense node. The sense node may be a semiconductor region from which a signal is output in accordance with the amount of charges accumulated therein.

Reference numeral 115 denotes a light shielding member. The light shielding member 115 reduces incident light to the charge holding portion 102, the transfer portion 103, and the sense node 104, or completely blocks incident light thereto.

Reference numeral 111 denotes a P-type semiconductor region (second semiconductor region). The P-type semiconductor region 111 is disposed in a surface portion between the control electrode 112 and the transfer gate electrode 113. Providing the P-type semiconductor region 111 enables suppression of a dark current in a charge transfer path for transferring charges to the FD 114.

Reference numeral 117 denotes an N-type semiconductor region (third semiconductor region). The N-type semiconductor region 117 is disposed under the P-type semiconductor region 111, at a position of a charge path extending from the charge holding portion 102 to the sense node 104. The N-type semiconductor region 117 is disposed at a deep position of the semiconductor substrate, compared to the N-type semiconductor region 110. The N-type semiconductor region 110 and the N-type semiconductor region 117 are formed in separate steps. The N-type semiconductor region 117 and the P-type well 107 form a PN junction. The surface of this PN junction (first PN junction surface) is at a deeper position than the surface of a PN junction between the N-type semiconductor region 110 constituting the charge holding portion 102 and the P-type well 107 (second PN junction surface). In a form of achieving such a relationship between the depths of the PN junction surfaces, the depth of diffusion of the N-type semiconductor region 117 is greater than the depth of diffusion of the N-type semiconductor region 110.

According to such a configuration, it is possible to suppress the occurrence of a portion of high impurity concentration in a charge transfer path, so that the occurrence of electron accumulation in the charge path between the charge holding portion 102 and the FD can be suppressed. The reason why such an effect can be obtained will be described below. As a comparative example, a case where the first PN junction surface and the second PN junction surface are at the same depth will be discussed. In such a case, the N-type semiconductor regions 110 and 117 have almost the same impurity concentration profile. Then, due to variations in ion implantation or diffusion of N-type impurity ion in the semiconductor region, a region of high N-type impurity concentration may locally occur. This high-concentration region is a low-potential region viewed from signal charges, and is likely to be a region where signal charges accumulate. The occurrence of signal charge accumulation may decrease charge transfer efficiency.

Next, a case where the first PN junction surface is disposed at a position shallower than the second PN junction surface will be discussed. In this case, the impurity concentration profile of the P-type semiconductor region 111, which is disposed to suppress a dark current, may be affected, and a substantial impurity concentration of the P-type semiconductor region 111 decreases, so that a sufficient effect of decreasing a dark current may not be obtained.

In contrast, according to this embodiment, accumulation of signal charges can be suppressed, and a sufficient effect of decreasing a dark current can be obtained.

Second Embodiment

Figure 2:
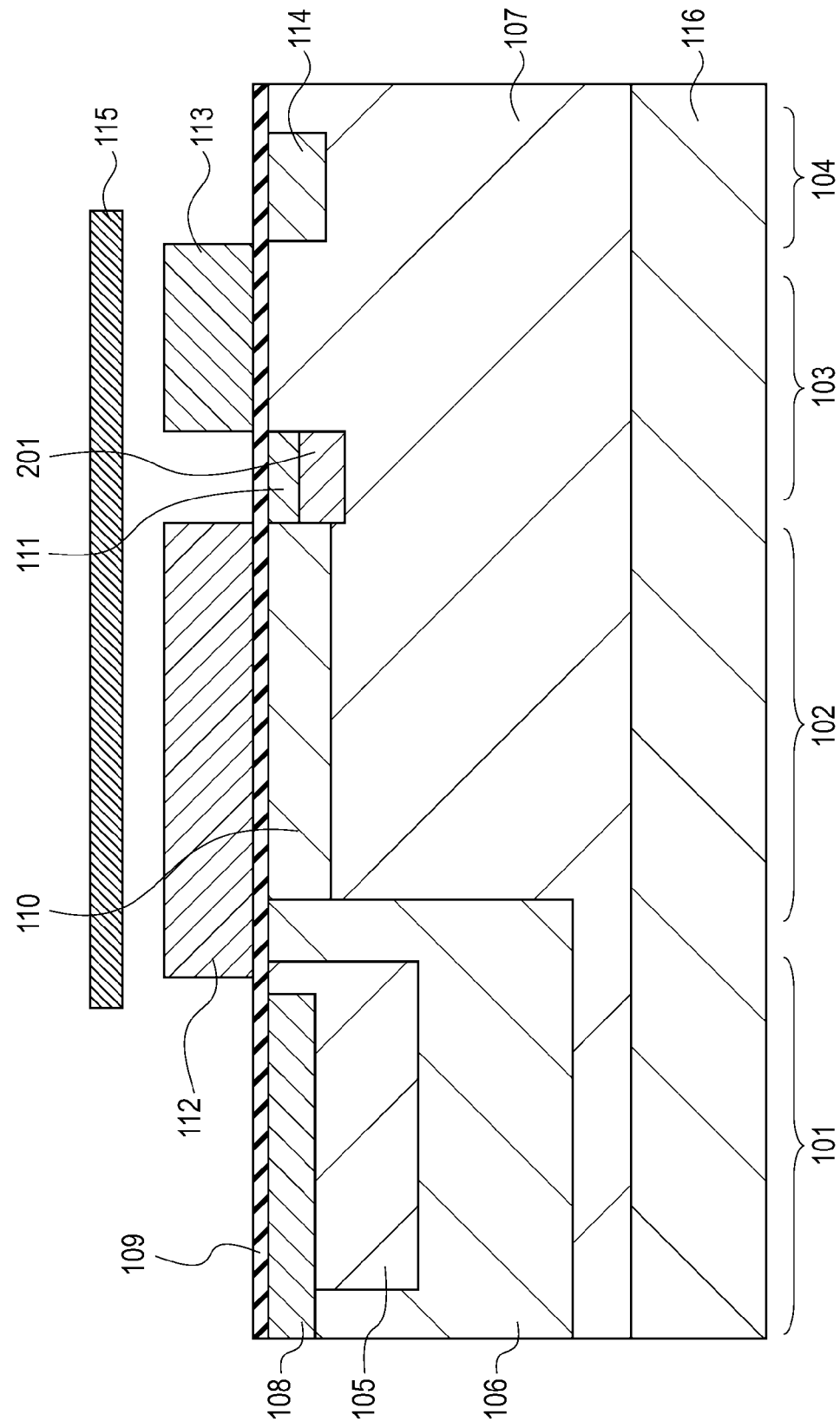
FIG. 2 is a schematic view of a cross section of a pixel of a solid-state image pickup device according to a second embodiment of the present invention.

FIG. 2 is a schematic view of a cross section of a pixel according to this embodiment. The parts having the same function as that in the first embodiment are denoted by the same reference numerals, and a detailed description thereof will be omitted.

A difference between this embodiment and the first embodiment is the impurity concentration of an N-type semiconductor region 201. Although the impurity concentration is not referred to in the first embodiment, the impurity concentration of the N-type semiconductor region 201 is higher than the impurity concentration of the N-type semiconductor region 110 in this embodiment.

According to this embodiment, the effect obtained in the first embodiment can be obtained, and also a transfer characteristic can be determined without depending on the impurity concentration of the charge holding portion 102. Thus, a saturation charge amount in the charge holding portion 102 can be designed independently of the transfer characteristic. Furthermore, a dark current that is caused by displacement due to variations in a process of the N-type semiconductor region 110 constituting the charge holding portion 102, and variations in saturation charge amount can be decreased.

Third Embodiment

Figure 3:
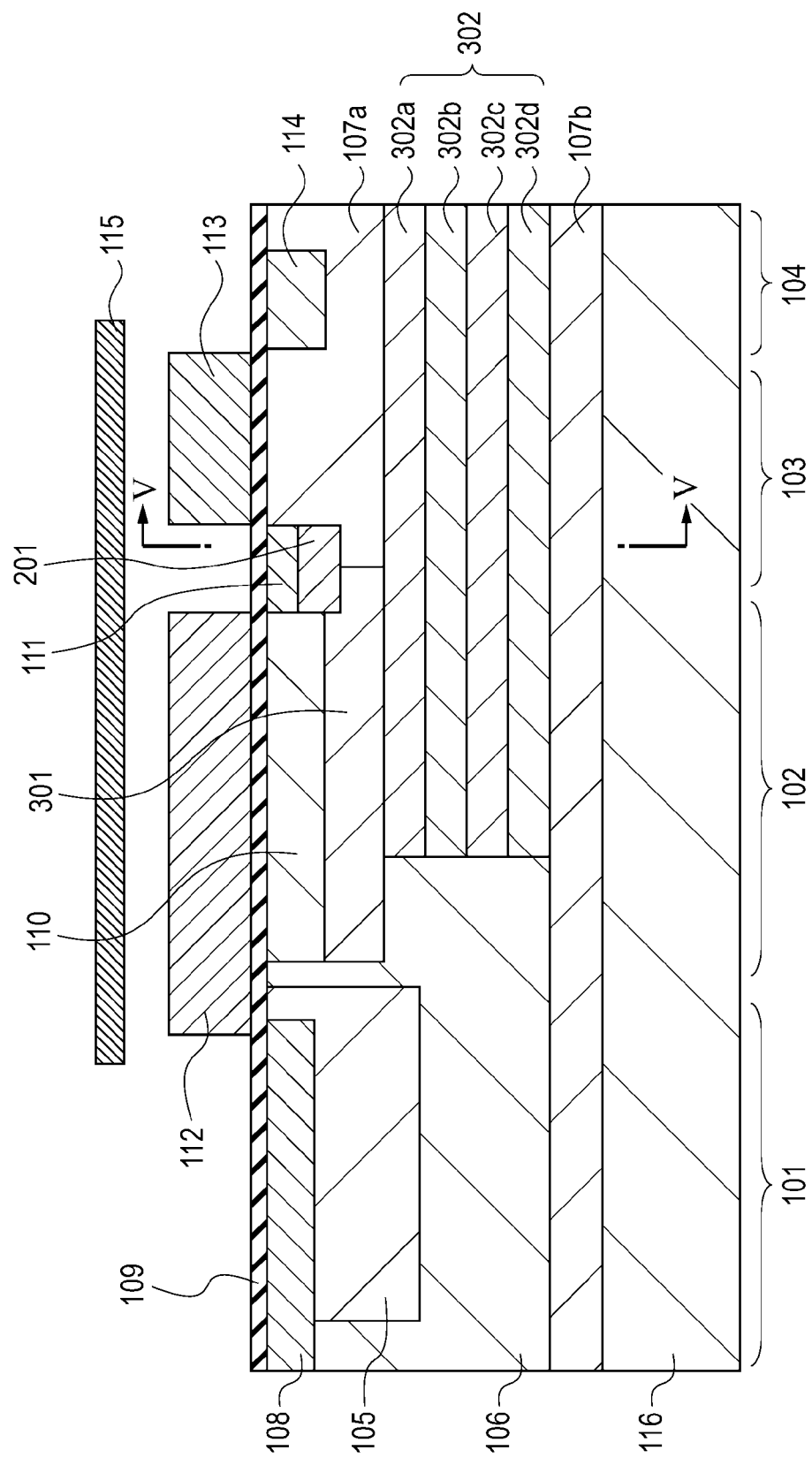
FIG. 3 is a schematic view of a cross section of a pixel of a solid-state image pickup device according to a third embodiment of the present invention.
Figure 4:
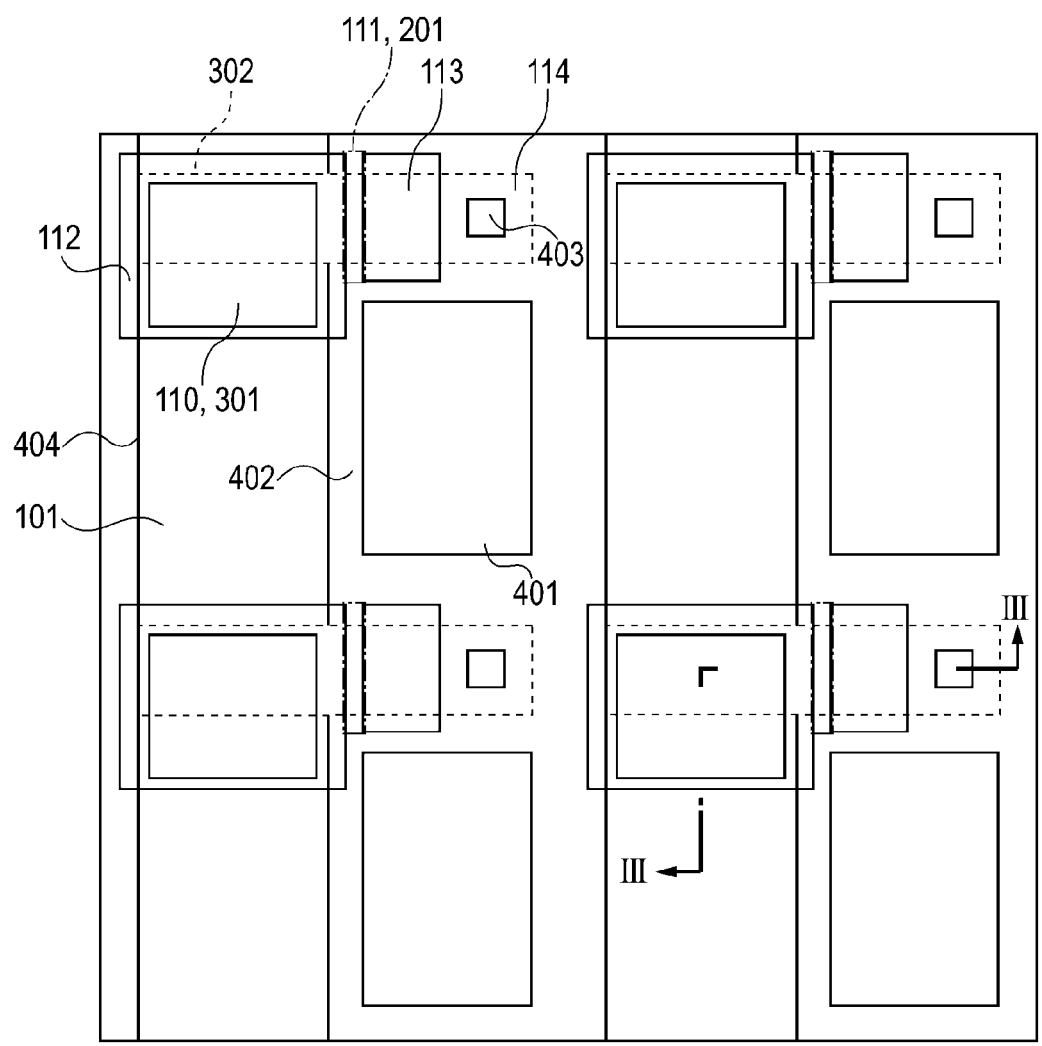
FIG. 4 is a schematic view of an upper surface of pixels of the solid-state image pickup device according to the third embodiment.
Figure 5:
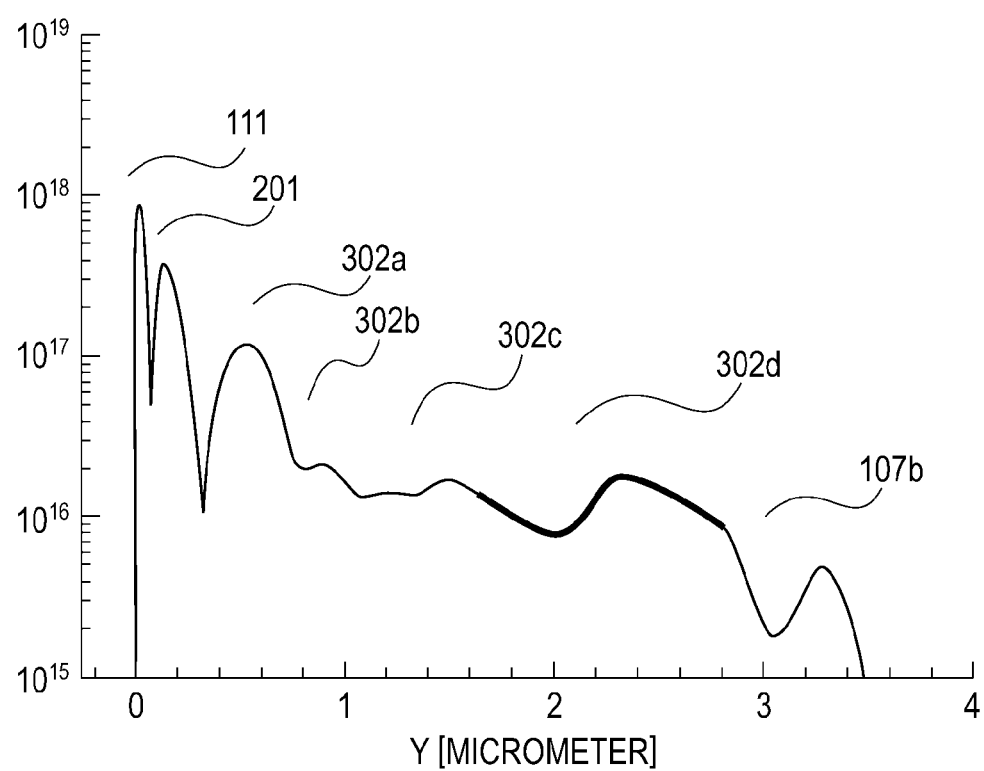
FIG. 5 is a conceptual view illustrating an impurity concentration profile in a V-V cross section in FIG. 3.

FIG. 3 is a schematic view of a cross section of a pixel according to this embodiment, and FIG. 4 is a top view of pixels. FIG. 5 is a conceptual view of an impurity profile in the V-V cross section in FIG. 3. FIG. 3 is a cross-sectional view of the III-III portion in FIG. 4. The parts having the same function as that in the first and second embodiments are denoted by the same reference numerals, and a detailed description thereof will be omitted.

A difference between this embodiment and the first and second embodiments is that a P-type semiconductor region 301 (fourth semiconductor region) is disposed under the N-type semiconductor region 110. Another difference is that a P-type semiconductor region 302 (fifth semiconductor region) including a plurality of semiconductor regions is disposed under the P-type semiconductor region 301. Here, the P-type semiconductor region 302 includes four P-type semiconductor regions 302a to 302d. The number of P-type semiconductor regions is not limited thereto.

The P-type semiconductor region 301 is a high-concentration P-type semiconductor region. The impurity concentration of the P-type semiconductor region 301 is higher than the impurity concentration of the P-type well 107. The P-type semiconductor region 301 forms a PN junction directly with the N-type semiconductor region 110 without via the P-type well 107. The impurity concentration profile in the depth direction of the P-type semiconductor region 301 may be a profile having an impurity concentration peak at a certain depth. The peak of the impurity concentration of the P-type semiconductor region 301 may be at a position shallower than 0.5 micrometers from the surface. This is because, if the peak is at a position shallower than 0.5 micrometers from the surface, a region of a low impurity concentration is not disposed between the N-type semiconductor region 110 and the high-concentration P-type semiconductor region 301. With this configuration, charges can be transferred from the charge holding portion 102 to the sense node 104 at a low voltage. This will be described in detail.

First, a mechanism of transferring charges from the charge holding portion 102 to the sense node 104 will be described. Before signal charges generated in the photoelectric conversion portion 101 are held in the N-type semiconductor region 110, a reset voltage is supplied to the N-type semiconductor region 110 via the sense node 104. Then, after the potential of the sense node 104 has been floated, the charges in the photoelectric conversion portion 101 are transferred to the N-type semiconductor region 110. Then, the charges are sequentially transferred from the charge holding portion 102 to the sense node 104. The transfer is performed in units of pixel rows or in units of a plurality of pixel rows. At this time, the N-type semiconductor region 110 is in a state where a reverse bias is supplied via the transfer portion 103. The reverse bias causes the N-type semiconductor region 110 to be depleted, so that the charges are transferred. In order to transfer most of or all of the charges held in the N-type semiconductor region 110 to the sense node 104, the most part of or the entire region of the N-type semiconductor region 110 needs to be depleted. In order to suppress expansion of a depletion layer at this time, the N-type semiconductor region 110 forms a PN junction together with the high-concentration P-type semiconductor region 301 without via the P-type well 107. This is because, since the impurity concentration of the P-type semiconductor region 301 that forms a PN junction together with the N-type semiconductor region 110 is high, expansion of a depletion layer to the P-type semiconductor region 301 is suppressed. Thus, even if a reverse bias voltage that is supplied via the transfer portion 103 is low, the most part of or the entire region of the N-type semiconductor region 110 can be depleted.

Furthermore, in this embodiment, the impurity concentration of the high-concentration P-type semiconductor region 301 is higher than the impurity concentration of a region that is at the same depth as the P-type semiconductor region 301 under the transfer path. In other words, the high-concentration P-type semiconductor region 301 does not extend to under the transfer gate electrode 113. With this configuration, the transfer path can be formed in the P-type well 107 under the transfer gate electrode 113 without increasing the bias voltage that is supplied to the transfer gate electrode 113.

Furthermore, in this embodiment, the P-type semiconductor region 302 is disposed under part of the P-type semiconductor region 301. The P-type semiconductor region 302 extends to under the transfer gate electrode 113 and under the FD 114.

The P-type well 107 includes two regions 107a and 107b. However, the P-type semiconductor region 302 may extend to under only at least part of each of the P-type semiconductor region 301, the transfer gate electrode 113, and the FD 114. Also, ion implantation may be further performed on the region 107b to form a P-type semiconductor region.

End portions of all or some of the plurality of semiconductor regions included in the P-type semiconductor region 302 are offset from the photoelectric conversion portion side in the same pixel, with an end portion of the charge holding portion 102 being a reference. The N-type semiconductor region 106 constituting part of the photoelectric conversion portion 101 is disposed in the offset portion.

In this embodiment, in each of a plurality of pixels, the end portion on the photoelectric conversion portion side of the P-type semiconductor region 302 is offset from the photoelectric conversion portion 101. This configuration may have sensitivity with respect to light entering in an oblique direction. Such an arrangement may be employed in all the pixels or some of the pixels.

Next, a description will be given with reference to FIG. 4. Reference numeral 401 denotes a portion where a circuit constituting a pixel is disposed. Specifically, the circuit includes an amplifying MOS transistor, a reset MOS transistor, and the like. An example of an equivalent circuit thereof will be described below. Reference numeral 402 denotes an element separation region. This is provided to separate active regions from each other. Any of a field region constituted by an insulating film and a diffusion separation constituted by PN junction separation is disposed. Reference numeral 403 denotes a contact plug that is electrically connected to the FD. The contact plug 403 electrically connects the FD to the gate of the amplifying MOS transistor. Reference numeral 404 denotes an active region where an element is disposed.

In FIG. 4, the region where the P-type semiconductor region 302 is disposed is indicated by a broken line, and the region where the P-type semiconductor region 111 and the N-type semiconductor region 201 are disposed is indicated by a chain line. It can be understood from FIG. 4 that the end portion of the P-type semiconductor region 302 is offset from the photoelectric conversion portion side in the same pixel, with the end portion of the charge holding portion 102 being a reference. As described above, the N-type semiconductor region 106 constituting part of the photoelectric conversion portion 101 is disposed in the offset portion.

FIG. 5 illustrates the impurity concentration profile in the V-V cross section in FIG. 3. The vertical axis indicates the net impurity concentration (net concentration) that is compensated for by impurity of the opposite conductivity type. The horizontal axis indicates the depth from one principal surface where a light receiving portion of the semiconductor substrate is disposed. Each of the P-type semiconductor regions 302a to 302d has a peak of impurity concentration. The P-type semiconductor regions 301 and 302 have a configuration in which a peak value is the highest in a region that is the closest to the surface.

As described above, according to this embodiment, an effect that the sensitivity of the photoelectric conversion portion 101 increases can be obtained in addition to the effects of the first and second embodiments.

[Method for Manufacturing Solid-State Image Pickup Device]

Figure 6A:
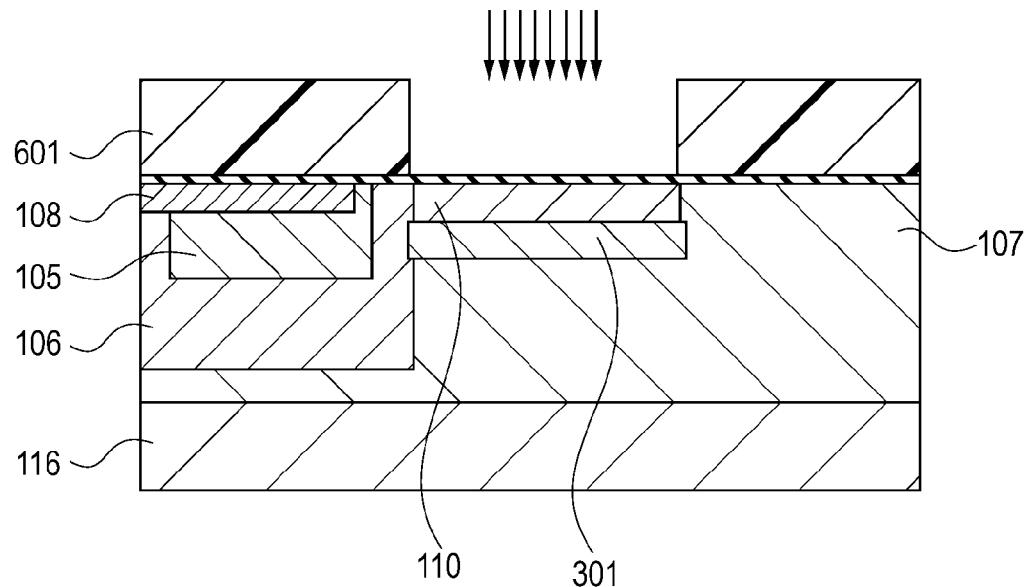
FIG. 6A is a cross-sectional view of a pixel illustrating an example of a method for manufacturing a solid-state image pickup device according to an embodiment of the present invention.
Figure 6B:
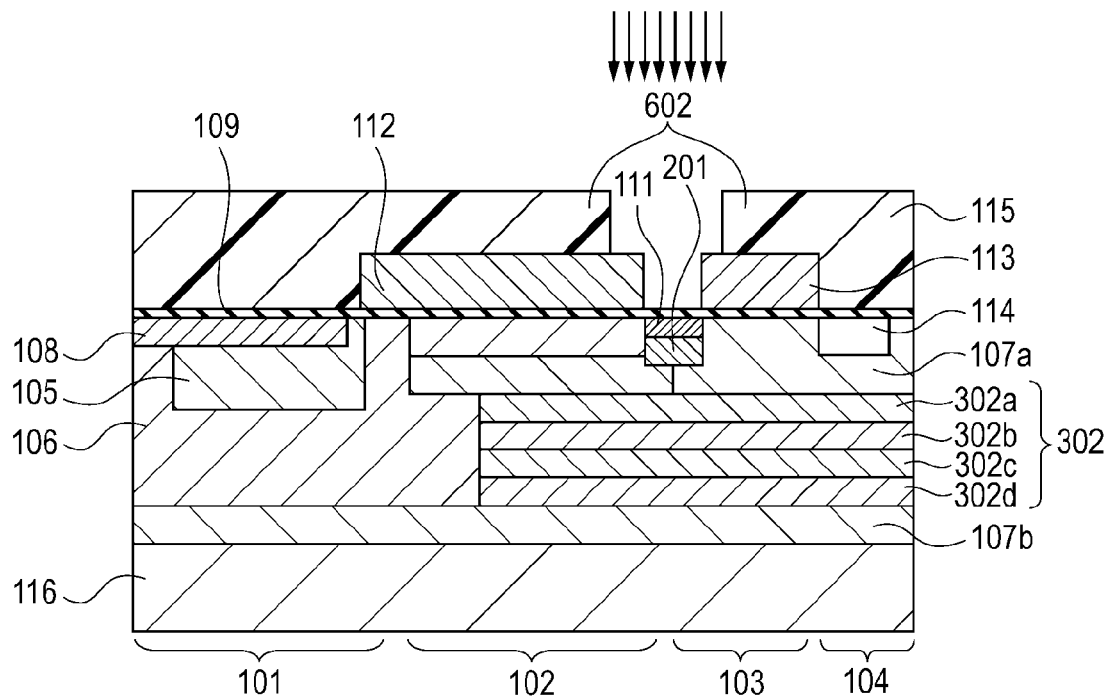
FIG. 6B is a cross-sectional view of a pixel illustrating the example of the method for manufacturing a solid-state image pickup device according to the embodiment of the present invention.

FIGS. 6A and 6B are schematic views of a cross section of a pixel for explaining a process of manufacturing a solid-state image pickup device according to an embodiment of the present invention. The parts having the same function as in each of the embodiments are denoted by the same reference numerals, and a detailed description thereof will be omitted.

A first feature of the manufacturing method is that the N-type semiconductor region 110 and the P-type semiconductor region 301 are formed using an identical mask (first mask). A second feature is that the P-type semiconductor region 111 and the N-type semiconductor region 201 that are disposed in a gap portion between the control electrode 112 and the transfer gate electrode 113 are formed using an identical mask.

A detailed description will be given with reference to FIGS. 6A and 6B. FIGS. 6A and 6B illustrate only the part related to this embodiment. A transistor, etc., in the other part can be manufactured using a known manufacturing method. FIG. 6A is a schematic view of a cross section of a pixel in a state where the P-type semiconductor region 301 is formed. Reference numeral 601 denotes a mask pattern formed of a photoresist.

First, a photoresist is formed over an entire surface of a substrate. Then, the photoresist is exposed so that an opening is formed in a region where the N-type semiconductor region 110 in the charge holding portion 102 is to be disposed.

As a first impurity implantation step of forming the N-type semiconductor region 110, an N-type impurity ion is implanted using a photoresist pattern formed in the exposure step as a mask pattern (first mask pattern). Arsenic or phosphorus may be used as impurity.

Subsequently, without a step of removing the photoresist mask, a P-type impurity ion is implanted as a second impurity implantation step of forming the high-concentration P-type semiconductor region 301. At this time, boron or the like may be used as impurity. Then, heat treatment is performed to recover from crystal defect or the like that occurs during ion implantation. In this way, the N-type semiconductor region 110 and the P-type semiconductor region 301 are formed using the identical mask pattern.

The first impurity implantation step of forming the N-type semiconductor region 110 and the second impurity implantation step of forming the P-type semiconductor region 301 may be performed in the reverse order.

After the N-type semiconductor region 110 and the P-type semiconductor region 301 have been formed, the photoresist mask 601 is removed.

Then, the P-type semiconductor region 302 is formed to be offset from the photoelectric conversion portion 101 using a mask difference from the foregoing first mask. Then, the control electrode 112 and the transfer gate electrode 113 are formed.

Next, a step of forming the P-type semiconductor region 111 and the N-type semiconductor region 201 will be described with reference to FIG. 6B.

First, a photoresist is formed over an entire surface of the substrate. Then, the photoresist is exposed to form a photoresistor mask (second mask) so that the semiconductor substrate is covered except the gap portion between the control electrode 112 and the transfer gate electrode 113. In order to perform ion implantation so that self-alignment is achieved with respect to the control electrode 112 and the transfer gate electrode 113, the photoresist is formed to cover at least part of the control electrode 112 and the transfer gate electrode 113 and the other region.

Then, ion implantation of a P-type impurity is performed with self-alignment with respect to the control electrode 112 and the transfer gate electrode 113, so as to form the P-type semiconductor region 111 (third impurity implantation step). Then, ion implantation of an N-type impurity is performed without removing the second mask, so as to form the N-type semiconductor region 201 (fourth impurity implantation step). As a condition of this ion implantation, ion implantation energy is set to be higher than that in the first impurity implantation step so that the N-type semiconductor region 201 is disposed at a deeper position than at least the N-type semiconductor region 110. Then, heat treatment is performed to recover from crystal defect or the like that occurs during ion implantation.

According to the above-described manufacturing method, the P-type semiconductor regions 301 and 111 and the N-type semiconductor region 201 can be formed without the necessity for significantly increasing the manufacturing steps. Furthermore, displacement of the N-type semiconductor region 110 and the P-type semiconductor region 301 in the direction horizontal to the substrate surface can be reduced. Accordingly, a portion where the N-type semiconductor region 110 and the P-type semiconductor region 301 directly form a PN junction can be increased. Also, displacement of the P-type semiconductor region 111 and the N-type semiconductor region 201 can be suppressed, and transfer variations of the individual pixels can be suppressed.

Any one of the first and second impurity implantation steps and the third and fourth impurity implantation steps may be performed using an identical mask.

[Equivalent Circuit of Solid-State Image Pickup Device]

Figure 7:
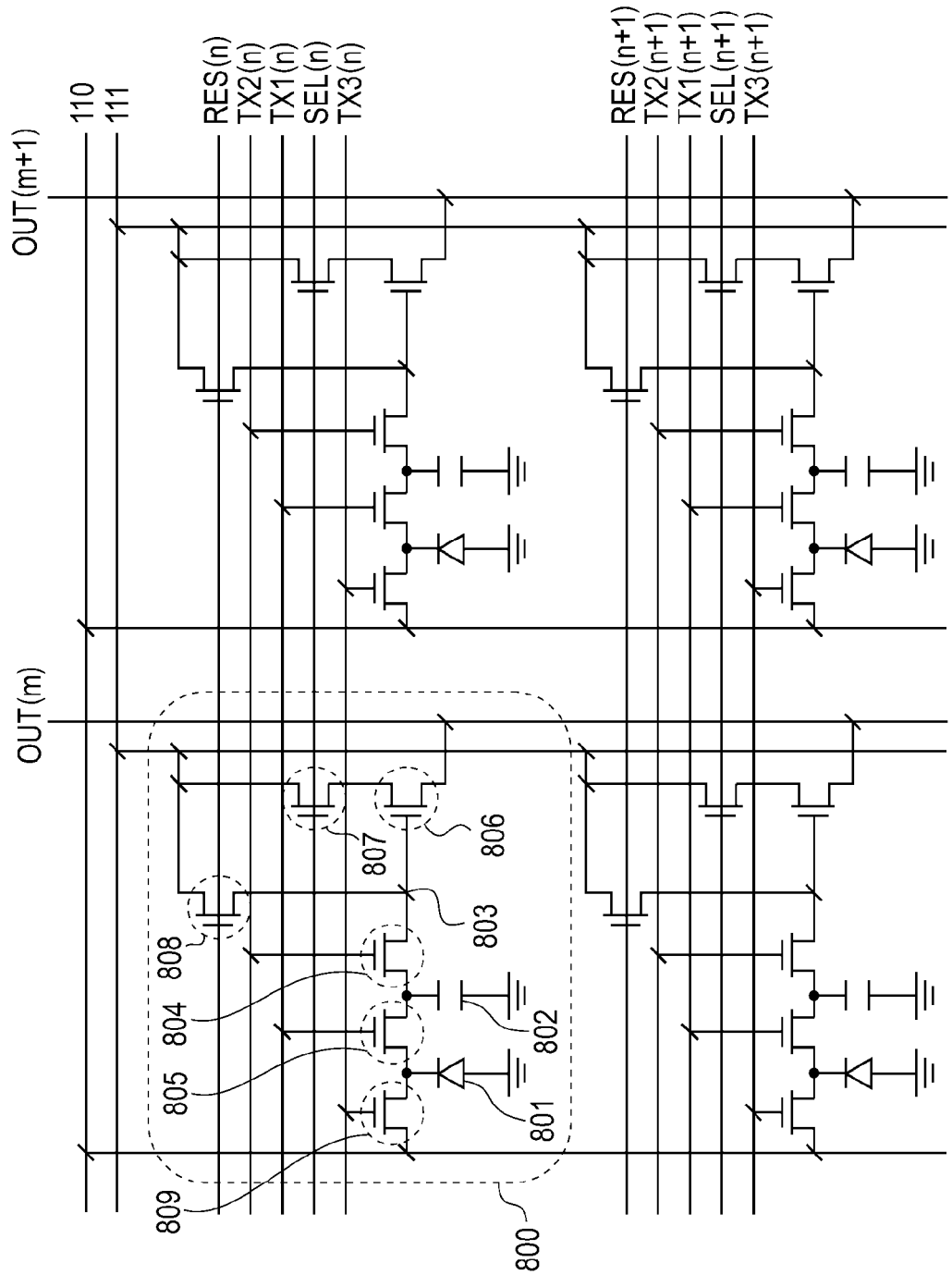
FIG. 7 is an equivalent circuit diagram of a solid-state image pickup device according to an embodiment of the present invention.

FIG. 7 is an equivalent circuit diagram of a solid-state image pickup device that can be applied to all the foregoing embodiments. The solid-state image pickup device having this equivalent circuit can perform a global electronic shutter operation.

Reference numeral 801 denotes a photoelectric conversion portion. A photodiode is used here. Reference numeral 802 denotes a charge holding portion, which holds signal charges generated by the photoelectric conversion portion 801. Reference numeral 803 denotes a sense node of an amplifying portion. For example, an FD and a gate electrode of an amplifying transistor that is electrically connected to the FD correspond to the sense node. Reference numeral 804 denotes a first transfer portion, which transfers charges in the charge holding portion 802 to the sense node 803 of the amplifying portion. Reference numeral 805 denotes a second transfer portion that is provided as necessary. The second transfer portion 805 can also function as a control electrode of the charge holding portion 802. The second transfer portion 805 may not have a transfer function, and may have only a function as the control electrode in the charge holding portion 802. The function of the second transfer portion 805 is transferring charges in the photoelectric conversion portion 801 to the charge holding portion 802. Reference numeral 808 denotes a reset portion, which supplies a reference voltage to at least an input portion of the amplifying portion. Furthermore, the reset portion 808 may supply a reference voltage to the charge holding portion 802. Reference numeral 807 denotes a selecting portion that is provided as necessary. The selecting portion 807 causes a signal line to output signals of respective pixel rows. Reference numeral 806 denotes an amplifying transistor constituting the amplifying portion. The amplifying transistor 806 constitutes a source follower circuit together with a constant current source provided to the signal line. Reference numeral 809 denotes a charge output control portion, which controls the connection between the photoelectric conversion portion 801 and a power supply line functioning as an overflow drain (hereinafter OFD).

The equivalent circuit is not limited thereto, and part of the configuration may be shared by a plurality of pixels. Also, the equivalent circuit is applicable to a configuration in which control wiring of individual elements is fixed to a constant voltage and in which control of conduction is not performed.

The second transfer portion 805 may have a buried channel MOS transistor configuration so that charges generated by the photoelectric conversion portion 801 immediately flow into the charge holding portion 802. In this configuration, there is a portion where an energy barrier is partially low at a portion deeper than a surface even in a non-conduction state. In this case, the second transfer portion 805 can be brought into a state where a certain voltage is supplied without performing active control. That is, a fixed potential barrier may be provided instead of a function as a transfer portion.

According to such a configuration, most of signal charges generated through photoelectric conversion when light enters the photoelectric conversion portion 801 are not accumulated in the photoelectric conversion portion 801 and can be transferred to the charge holding portion 802. Accordingly, a charge accumulation time can be made uniform in the photoelectric conversion portions 801 of all the pixels. Also, when the MOS transistor is in a non-conduction state, holes are accumulated on the surface of a channel, and the channel for transferring charges exists at a predetermined depth with respect to the surface. Thus, an influence of a dark current on the interface of an insulating film can be reduced.

From another point of view, during a period when signal charges are accumulated in the photoelectric conversion portion 801 and the charge holding portion 802, the potential of the charge path between the photoelectric conversion portion 801 and the charge holding portion 802 is lower than the potential of the charge path between the photoelectric conversion portion 801 and the OFD region. Here, the potential means the potential with respect to signal charges.

Furthermore, from the viewpoint of drive, charges moved from the photoelectric conversion portion 801 to the charge holding portion 802 in one exposure period are held in the charge holding portion 802 and are used as an image signal. That is, after one exposure period in the photoelectric conversion portion 801 starts, a signal is read from the pixel without through a reset operation of the charge holding portion 802. Note that one exposure period is commonly determined in the individual photoelectric conversion portions 801 when an image of one frame is captured.

In such a pixel configuration, charges can be transferred at a low voltage from the photoelectric conversion portion 801 to the charge holding portion 802, which is more appropriate from the viewpoint of increasing charge transfer efficiency at a low voltage in combination with the embodiments of the present invention.

In such a configuration, global exposure can be performed relatively easily, but the charges in the photoelectric conversion portion 801 are discharged to the OFD region during transfer from the charge holding portion 802 to the FD region. Thus, an image is intermittent. In a case where continuity of an image is particularly necessary in such a configuration, a continuous image can be obtained by performing line exposure. Both can be switched as necessary.

Also, an embodiment of the present invention can be carried out also in a solid-state image pickup device in which a charge holding portion is provided in each pixel for increasing a dynamic range and in which charges are transferred from the charge holding portion to a sense node.

The present invention is not limited to the foregoing individual embodiments, and various modifications are acceptable without deviating from the concept of the invention. For example, an embodiment of the present invention can be applied to a configuration that does not include the control electrode 112. For example, the N-type semiconductor region 110 may be selectively connected to the power via the contact plug and switch.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-235089, filed Oct. 9, 2009, which is hereby incorporated by reference herein in its entirety.

REFERENCE SIGNS LIST

101 Photoelectric conversion portion
102 Charge holding portion
111 P-type semiconductor region
112 Control electrode
113 Transfer gate electrode
117 and 201 N-type semiconductor region

The invention claimed is:

1. A solid-state image pickup device including a plurality of pixels, each of the plurality of pixels comprising:
   a photoelectric conversion portion configured to generate charges in accordance with incident light;
   a charge holding portion configured to include a first-conductivity-type first semiconductor region that holds the charges generated by the photoelectric conversion portion in a portion different from the photoelectric conversion portion; and
   a transfer portion configured to include a transfer gate electrode that controls a potential between the charge holding portion and a sense node,
   wherein the charge holding portion includes a control electrode that is disposed above the first semiconductor region via an insulating film,
   wherein a second-conductivity-type second semiconductor region is disposed on a surface of a semiconductor region between the control electrode and the transfer gate electrode,
   wherein a first-conductivity-type third semiconductor region is disposed under the second semiconductor region, at a position of a charge path extending from the charge holding portion to the sense node,
   wherein a second-conductivity-type well is disposed under the third semiconductor region, and
   wherein the third semiconductor region is disposed at a deeper position than the first semiconductor region.

2. A solid-state image pickup device including a plurality of pixels, each of the plurality of pixels comprising:
   a photoelectric conversion portion configured to generate charges in accordance with incident light;
   a charge holding portion configured to include a first-conductivity-type first semiconductor region that holds the charges generated by the photoelectric conversion portion in a portion different from the photoelectric conversion portion; and
   a transfer portion configured to include a transfer gate electrode that controls a potential between the charge holding portion and a sense node,
   wherein the charge holding portion includes a control electrode that is disposed above the first semiconductor region via an insulating film,
   wherein a second-conductivity-type second semiconductor region is disposed on a surface of a semiconductor region between the control electrode and the transfer gate electrode,
   wherein a first-conductivity-type third semiconductor region is disposed under the second semiconductor region, at a position of a charge path extending from the charge holding portion to the sense node,
   wherein the third semiconductor region is disposed at a deeper position than the first semiconductor region, and
   wherein an impurity concentration of the third semiconductor region is higher than an impurity concentration of the first semiconductor region.

3. The solid-state image pickup device according to claim 1, wherein a second-conductivity-type fourth semiconductor region is disposed under the first semiconductor region so as to form a PN junction together with the first semiconductor region.

4. The solid-state image pickup device according to claim 3, wherein the sense node includes a floating diffusion, and wherein a second-conductivity-type fifth semiconductor region is disposed at a deeper position than the fourth semiconductor region, the fifth semiconductor region extending under the transfer gate electrode, the floating diffusion, and at least part of the fourth semiconductor region.

5. The solid-state image pickup device according to claim 4, wherein the fifth semiconductor region is configured to include a plurality of second-conductivity-type semiconductor regions that are at different depths.

6. The solid-state image pickup device according to claim 5, wherein, in each of the pixels, an end portion on a photoelectric conversion portion side of the fifth semiconductor region is at a position away from the photoelectric conversion portion compared to an end portion on a photoelectric conversion portion side of the first semiconductor region, and
   wherein a first-conductivity-type semiconductor region that constitutes part of the photoelectric conversion portion is disposed under at least part of the first semiconductor region.

7. The solid-state image pickup device according to claim 1, wherein a charge path extending between the photoelectric conversion portion and the charge holding portion is a buried channel.

8. A method for manufacturing the solid-state image pickup device according to claim 1, wherein the second semiconductor region and the third semiconductor region are formed using an identical mask in a self-aligned manner with respect to the control electrode and the transfer gate electrode.

9. The solid-state image pickup device according to claim 1, further comprising a substrate, wherein the second-conductivity-type well is disposed on the substrate.

10. The solid-state image pickup device according to claim 1, wherein the first-conductivity-type third semiconductor region is disposed under the second semiconductor region between the control electrode and the transfer gate electrode.

11. A solid-state image pickup device including a plurality of pixels, each of the plurality of pixels comprising:
    a photoelectric conversion portion configured to generate charges in accordance with incident light;
    a charge holding portion configured to include a first-conductivity-type first semiconductor region that holds the charges generated by the photoelectric conversion portion in a portion different from the photoelectric conversion portion; and
    a transfer portion configured to include a transfer gate electrode that controls a potential between the charge holding portion and a sense node,
    wherein the charge holding portion includes a control electrode that is disposed above the first semiconductor region via an insulating film,
    wherein a second-conductivity-type second semiconductor region is disposed on a surface of a semiconductor region between the control electrode and the transfer gate electrode,
    wherein a first-conductivity-type third semiconductor region is disposed under the second semiconductor region, at a position of a charge path extending from the charge holding portion to the sense node, the first-conductivity-type third semiconductor region not extending to the photoelectric conversion portion, and
    wherein the third semiconductor region is disposed at a deeper position than the first semiconductor region.

12. A solid-state image pickup device including a pixel, the pixel comprising:
    a photoelectric conversion portion configured to generate charges in accordance with incident light;
    a charge holding portion configured to include a first-conductivity-type first semiconductor region that holds the charges generated by the photoelectric conversion portion, the charge holding portion being different from the photoelectric conversion portion and the charges being transferred from the charge holding portion to a sense node; and a transfer portion configured to include a transfer gate electrode that controls a potential between the charge holding portion and the sense node, wherein the charge holding portion includes a control electrode that is disposed above the first semiconductor region through an insulating film, wherein a second-conductivity-type second semiconductor region is disposed between the control electrode and the transfer gate electrode, wherein a first-conductivity-type third semiconductor region is disposed under the second semiconductor region in a depth direction, wherein a second-conductivity-type well is disposed under the third semiconductor region, and wherein at least a portion of the third semiconductor region is disposed at a deeper position than the first semiconductor region in the depth direction.

13. The solid-state image pickup device according to claim 12, further comprising a substrate, wherein the second-conductivity-type well is disposed on the substrate.

14. A solid-state image pickup device including a pixel, the pixel comprising:

a photoelectric conversion portion configured to generate charges in accordance with incident light;

a charge holding portion configured to include a first-conductivity-type first semiconductor region that holds the charges generated by the photoelectric conversion portion, the charge holding portion being different from the photoelectric conversion portion and the charges being transferred from the charge holding portion to a sense node; and a transfer portion configured to include a transfer gate electrode that controls a potential between the charge holding portion and the sense node, wherein the charge holding portion includes a control electrode that is disposed above the first semiconductor region through an insulating film, wherein a second-conductivity-type second semiconductor region is disposed between the control electrode and the transfer gate electrode, wherein a first-conductivity-type third semiconductor region is disposed under the second semiconductor region in a depth direction, the third semiconductor region not extending to the photoelectric conversion portion and wherein at least a portion of the third semiconductor region is disposed at a deeper position than the first semiconductor region in the depth direction.

15. A solid-state image pickup device including a pixel, the pixel comprising:

a photoelectric conversion portion configured to generate charges in accordance with incident light;

a charge holding portion configured to include a first-conductivity-type first semiconductor region that holds the charges generated by the photoelectric conversion portion, the charge holding portion being different from the photoelectric conversion portion and the charges being transferred from the charge holding portion to a sense node; and a transfer portion configured to include a transfer gate electrode that controls a potential between the charge holding portion and the sense node, wherein the charge holding portion includes a control electrode that is disposed above the first semiconductor region through an insulating film, wherein a second-conductivity-type second semiconductor region is disposed between the control electrode and the transfer gate electrode, wherein a first-conductivity-type third semiconductor region is disposed under the second semiconductor region in a depth direction, wherein at least a portion of the third semiconductor region is disposed at a deeper position than the first semiconductor region in the depth direction, and wherein an impurity concentration of the third semiconductor region is higher than an impurity concentration of the first semiconductor region.

* * * * *